(12) United States Patent  
Cui

(10) Patent No.: US 10,734,583 B2  
(45) Date of Patent: Aug. 4, 2020

(54) ELECTROLUMINESCENT SUBSTRATE PLATE, METHOD FOR MANUFACTURING THE SAME AND DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/180,230

(22) Filed: Nov. 5, 2018

(65) Prior Publication Data  
US 2019/0189923 A1 Jun. 20, 2019

(30) Foreign Application Priority Data  
Dec. 15, 2017 (CN) .......................... 2017 1 1348484

(51) Int. Cl.  
*H01L 51/56* (2006.01)  
*H01L 51/00* (2006.01)  
*H01L 51/52* (2006.01)  
*H01L 27/32* (2006.01)

(52) U.S. Cl.  
CPC ...... *H01L 51/0007* (2013.01); *H01L 51/0005* (2013.01); *H01L 51/56* (2013.01); *H01L 27/3246* (2013.01); *H01L 51/5246* (2013.01)

(58) Field of Classification Search  
CPC combination set(s) only.  
See application file for complete search history.

(56) References Cited

U.S. PATENT DOCUMENTS

| 9,761,801 B2 | 9/2017 | Kang |
| 9,947,731 B2 | 4/2018 | Jiao et al. |
| 9,969,180 B2 | 5/2018 | Zhao et al. |
| 2003/0146710 A1* | 8/2003 | Nakanishi ........... H01L 27/3223 315/169.3 |

FOREIGN PATENT DOCUMENTS

| CN | 103862862 A | 6/2014 |
| CN | 104260554 A | 1/2015 |
| CN | 104882468 A | 9/2015 |

OTHER PUBLICATIONS

First Office Action dated Nov. 28, 2019 for corresponding Chinese Application 201711348484.9.

* cited by examiner

*Primary Examiner* — Fernando L Toledo  
*Assistant Examiner* — Valerie N Newton  
(74) *Attorney, Agent, or Firm* — Nath, Goldberg & Meyer; Joshua B. Goldberg

(57) ABSTRACT

The present disclosure discloses an electroluminescent substrate plate, a method of manufacturing the same, and a display device. The method includes printing an ink comprising a light-emitting layer material and a solvent capable of dissolving the light-emitting layer material in a display region of a substrate; and printing a solvent in a region other than the display region. Thus, the method can easily obtain an electroluminescent substrate plate, and the manufactured electroluminescent substrate plate can satisfy the dry atmosphere consistency of the display region and the peripheral region during the film formation by inkjet printing, can significantly improve the film thickness uniformity of the display region, and at the same time is beneficial to the design requirements of a large size and a narrow frame.

7 Claims, 4 Drawing Sheets

ELECTROLUMINESCENT SUBSTRATE PLATE, METHOD FOR MANUFACTURING THE SAME AND DISPLAY DEVICE

CROSS-REFERENCE TO RELATED APPLICATION

This application claims a priority to Chinese Patent Application No. 201711348484.9, entitled with "Electroluminescent Display Back Plate, Method for manufacturing the same and Display Device", submitted on Dec. 15, 2017, the disclosure of which is incorporated herein in its entirety by reference.

TECHNICAL FIELD

The present disclosure relates to a field of display technology, particularly to an electroluminescent substrate plate, a method for manufacturing the same and a display device.

BACKGROUND

At present, an organic electroluminescence (OLED) display technology is developing rapidly. As an important one in the OLED display technology, a polymer electroluminescence (PLED) display technology is used more and more widely. Since a technology for preparing a PLED display device by inkjet printing (inkjet printing PLED technology) has advantages such as simple operation, low cost, simple process, and easy realization of large size, and with the continuous development of high-performance polymer materials and the further improvement in a thin film preparation technology, the inkjet printing PLED technology is expected to be rapidly industrialized. However, the current electroluminescent substrate plate, the method for manufacturing the same and the display device still need to be improved.

SUMMARY

The present disclosure provides the following technical solutions.

In one aspect of the present disclosure, a method of manufacturing an electroluminescent substrate plate is provided. According to some embodiments of the present disclosure, the electroluminescent substrate plate comprises a substrate and a light-emitting layer on the substrate, the method comprises: printing an ink in a display region of the substrate, the ink comprises a light-emitting layer material, and a solvent capable of dissolving the light-emitting layer material; and printing a solvent in a region other than the display region of the substrate.

According to some embodiments of the present disclosure, the substrate further comprises an encapsulating region configured to surround the display region, and optionally, a boundary of the region where the solvent is printed is away from a printing boundary on one side of the display region and extends into the encapsulating region. According to some embodiments of the present disclosure, a pixel defining layer is disposed on the substrate before printing the ink, the pixel defining layer comprises openings arranged in an array, and the ink is printed into the openings. An orthographic projection of the openings on the substrate is located within the display region, and the solvent is printed in a region other than the display region.

According to some embodiments of the present disclosure, a virtual region is also included between the display region and the encapsulating region, and said printing a solvent further comprises: printing a solvent in the virtual region; and printing a solvent added with a tackifier in the encapsulating region. According to some embodiments of the present disclosure, an orthographic projection of the pixel defining layer on the substrate overlaps an orthographic projection of the virtual region on the substrate, and said printing a solvent in the virtual region comprises printing the solvent on the pixel defining layer in the virtual region.

According to some embodiments of the present disclosure, an orthographic projection of the pixel defining layer on the substrate does not overlap an orthographic projection of the virtual region on the substrate, and said printing a solvent in the virtual region comprises printing the solvent in the virtual region on the substrate.

According to some embodiments of the present disclosure, an orthographic projection of the pixel defining layer on the substrate does not overlap an orthographic projection of the encapsulating region on the substrate, and the solvent added with a tackifier is printed in the portion of the substrate in the encapsulating region. In another aspect of the present disclosure, the present disclosure provides an electroluminescent substrate plate. According to some embodiments of the present disclosure, the electroluminescent substrate plate is manufactured using the methods as described above.

In yet another aspect of the present disclosure, the present disclosure provides an electroluminescent substrate plate. The electroluminescent substrate plate comprises: a substrate including a display region; and a light-emitting layer on the substrate, the light-emitting layer being formed of an ink comprising a light-emitting layer material, and a solvent capable of dissolving the light-emitting layer material, wherein an orthographic area of a region where the light-emitting layer material is located on the substrate is less than or equal to an area of the display region.

According to some embodiments of the present disclosure, the electroluminescent substrate plate may be an electroluminescent substrate plate as described above or be manufactured using the methods as described above.

According to some embodiments of the present disclosure, a virtual region is further defined on the substrate, the virtual region is disposed to surround the display region and is configured to receive the solvent for printing, and a pixel defining layer comprising openings arranged in an array is disposed on the substrate. An orthographic projection of the openings on the substrate does not overlap the virtual region, and the light-emitting layer material is located at the openings.

According to some embodiments of the present disclosure, an orthographic projection of the pixel defining layer on the substrate overlaps the virtual region, and the pixel defining layer located in the virtual region is configured to receive the solvent for printing. According to some embodiments of the present disclosure, an orthographic projection of the pixel defining layer on the substrate does not overlap the virtual region, and the virtual region on the substrate is configured to receive the solvent for printing. According to some embodiments of the present disclosure, at least a portion of a surface of the pixel defining layer is formed of a hydrophobic material.

According to some embodiments of the present disclosure, the substrate further comprises an encapsulating region, the virtual region is located between the encapsulating region and the display region, and the electroluminescent substrate plate further comprises: an auxiliary encapsulating layer disposed in the encapsulating region and formed of the solvent to which an adhesive is added.

In still another aspect of the present disclosure, the present disclosure provides a display device. According to some embodiments of the present disclosure, the display device includes the electroluminescent substrate plate as described above.

BRIEF DESCRIPTION OF THE FIGURES

The above and/or additional aspects and advantages of the present disclosure will become apparent and readily understood from the description of the embodiments in connection with the following figures, wherein.

DETAILED DESCRIPTION

Figure 1:
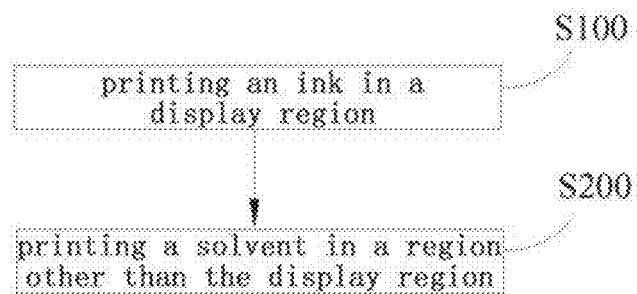
FIG. 1 shows a schematic flow diagram of a method for manufacturing an electroluminescent substrate plate in accordance with some embodiments of the present disclosure.

The embodiments of the present disclosure are described in detail below, and the examples of the embodiments are illustrated in the accompanying drawings, wherein the same or similar reference numerals are used to refer to the same or similar elements or elements having the same or similar functions. The embodiments described below with reference to the accompanying drawings are intended to be illustrative only, and are not to be considered as limiting.

Inkjet printing is to spray coat a solution containing active materials, such as a hole transporting material (such as PEDOT/PSS (doped polyaniline)) and a red, green or blue light-emitting material onto a sub-pixel pit on a previously patterned substrate respectively, through a micron-sized printing head, thereby forming red, green and blue three primary color light-emitting pixel units, and a thickness of the formed film layer is determined by an amount of solute printed in the pixels. The method can greatly save expensive light-emitting materials, and can greatly shorten a film formation time by using a head having a plurality of ejection ports (for example, having 128 or 256 ejection ports).

The inventors of the present application have found that currently the electroluminescent substrate plate manufactured by inkjet printing has a problem that it is difficult to truly achieve a narrow frame. The inventors have conducted intensive research and a large number of experiments, and found that this is mainly due to the fact that the current substrate plate needs to manufacture a wider virtual pixel area around a display region. In the manufacture of an electroluminescent substrate plate by the inkjet printing technology, the solvent vapor of the droplets deposited by the inkjet printing is mainly volatilized by an edge region of the droplet, and a change in a volume of the solution mainly occurs in the central region of the droplet during the film formation by drying. Therefore, the inkjet printing will allow the inside of the droplet to form a solution flow from the center to the edge, which will drive the solute to migrate to the edge of the droplet, and make the solute finally deposit at the edge, eventually forming a depositional morphology with thick at the edge and thin at the center, and resulting in a coffee ring effect. That is, for an electroluminescent thin film obtained by depositing an electroluminescent material by inkjet printing, since the pixels at the edge of the substrate plate are different from the pixels in the middle in terms of the dry atmosphere, the edge pixels are dried too fast, resulting in uneven film thickness in the light-emitting region, which affects the overall film thickness uniformity, and seriously affects the performance of the light-emitting device. In order to solve the problem of uneven film thickness and poor display in the above-mentioned light-emitting region, it is necessary to make a circle of virtual pixel layer around the light-emitting region (or called DUMMY region) to ensure the atmosphere consistency of the printed substrate in the middle of the light-emitting region and the peripheral region during the drying treatment. Specifically, it is necessary to ink-jet print the same ink (having a light-emitting material and a solvent) as the light-emitting region in the virtual pixel region around the periphery of the light-emitting region. Although the existing technology can ensure the consistency of the drying atmosphere of the light-emitting layer and the peripheral region, the ink that is ink-jet printed in the virtual pixel region will leave a light-emitting material after the vacuum drying treatment, which will eventually form a virtual pixel layer structure. However, the virtual pixel layer is an invalid structure for the late light emission, and the virtual pixel layer cannot be encapsulated (affecting the encapsulating effect). Therefore, it is necessary to provide an encapsulating region on the periphery of the DUMMY area, which makes it difficult to narrow the frame. At present, the improvement of the film thickness uniformity of the light-emitting region is still limited, which is disadvantageous for maintaining the consistency of the drying atmosphere in inkjet printing of a large-sized substrate plate. Therefore, if it is possible to provide a method for preparing an electroluminescent substrate plate that narrows the virtual pixel layer, or even without a virtual pixel layer, and the consistency of the drying atmosphere of the light-emitting region and the peripheral region is satisfied during the film formation by inkjet printing, the uniformity of the film thickness of the light-emitting region of the manufactured display substrate plate can be remarkably improved, and at the same time, the design requirements of the large-size and narrow-frame are favorable.

The present disclosure is intended to alleviate or solve at least one of the above mentioned problems at least to some extent. In one aspect of the present disclosure, a method of manufacturing an electroluminescent substrate plate is provided. The method can easily obtain an electroluminescent substrate plate, and the manufactured electroluminescent substrate plate can satisfy the drying atmosphere consistency of the display region and the peripheral region during the film formation by inkjet printing without providing a pixel defining layer, can significantly improve the film thickness uniformity of the display region, and at the same time facilitate the design requirements of a large size and a narrow frame. According to some embodiments of the present disclosure, referring to FIG. 1, the method includes:

S100: Printing an Ink in a Display Region

In this step, the ink is printed in the display region of the substrate, in which the ink comprises a light-emitting layer material, and a solvent capable of dissolving the light-emitting layer material. After the subsequent drying treatment, the solvent in the ink volatilizes, and the remaining light-emitting layer material can form a light-emitting layer, whereby the light-emitting layer can be easily formed in the display region.

According to some embodiments of the present disclosure, the specific type of the substrate is not particularly limited, and those skilled in the art can select them according to actual needs. For example, according to some embodiments of the present disclosure, the substrate may be a glass or a flexible substrate plate. According to some embodiments of the present disclosure, the specific types of the light-emitting layer material and the solvent for dissolving the light-emitting layer material are not particularly limited, and those skilled in the art can select them according to actual needs. For example, the solvent may be selected from the group consisting of aromatic esters, aromatic hydrocarbons, or any combination thereof.

According to some embodiments of the present disclosure, a pixel defining layer is disposed on the substrate. According to some embodiments of the present disclosure, a specific forming material of the pixel defining layer is not particularly limited, and for example, at least a portion of the surface of the pixel defining layer may be formed of a hydrophobic material. For example, the material of the pixel defining layer is selected from an organic material, an inorganic material, or a combination thereof. The organic material may include polyimide, PMMA photoresist, polyimide photoresist, silicone photoresist, and the like. The inorganic material may include an aqueous silica solution system, a silica alcohol solution system or the like.

According to some embodiments of the present disclosure, the specific formation manner of the pixel defining layer is not particularly limited. For example, the pixel defining layer may include openings arranged in an array, and the orthographic projection of the openings on the substrate is located within the display region, that is, the orthographic projection of the pixel defining layer on the substrate is located within the display region, and printing an ink in the display region is achieved by printing the ink into the openings. Thus, the above-described openings can be used to define pixel structures in the display region so as to avoid color mixing between different pixel structures. It should be noted that after the subsequent vacuum drying treatment, the solvent in the ink printed in the display region will volatilize, and the remaining light-emitting layer material will form a light-emitting layer for light emission.

S200: Printing a Solvent in a Region Other than the Display Region

In this step, the solvent is printed in a region other than the display region. Thereby, the method can easily obtain an electroluminescent substrate plate, and the manufactured electroluminescent substrate plate can satisfy the consistency of the drying atmosphere of the display region and the peripheral region during the film formation by inkjet printing, can significantly improve the film thickness uniformity of the display region, and at the same time facilitate the design requirements of a large size and a narrow frame.

In order to facilitate understanding, the principle of implementing the above technical effects by the method is described in detail below:

As described above, at present, the effect of solving the problem of the consistency of the drying atmosphere between the light-emitting layer and the peripheral region is still limited, and a virtual pixel layer (a light-emitting material left by the ink printed in the virtual pixel area) is formed. The virtual pixel layer is an ineffective area for light emission, which is not conducive to the design requirements of a large size and a narrow frame. According to some embodiments of the present disclosure, ink (containing a light-emitting material and a solvent) is printed only in the display region, and only the same solvent (without a light-emitting material) as the ink is printed in an region (peripheral region) other than the display region. Thus, the method has at least one of the following advantages: First, in the subsequent vacuum drying treatment, the solvent is printed in both the display region and the peripheral region, and thus the solvent in both the display region and the peripheral region is simultaneously dried and volatilized. Therefore, it can be ensured that when drying, the drying atmosphere in both the display region and the peripheral region is consistent, that is, the consistency of the drying atmosphere of the display region and the peripheral region is ensured, thereby avoiding the coffee ring effect, and avoiding the film thickness unevenness of the light-emitting layer (formed by the light-emitting material) formed after the final drying. Secondly, only the same solvent as the display region is printed in the peripheral region, and no light-emitting material is contained in the peripheral region. In the subsequent drying treatment, the solvent in the peripheral region is completely volatilized. Therefore, the light-emitting material is not left in the peripheral region, and the virtual pixel layer is not formed. Therefore, it is advantageous for the design of the narrow frame. Then, since the light-emitting material is not left in the peripheral region, the area of the solvent printed in the peripheral region can be made larger than that of the conventional virtual pixel region, or the area of the solvent printing in the peripheral region can be extended into the encapsulating region, thereby further improving the consistency of the drying atmosphere. Even if the film thickness unevenness caused by the coffee ring effect occurs during the drying treatment, the film thickness unevenness only occurs in the peripheral region, and does not affect the film formation in the display region, thereby further improving the uniformity of the film thickness of the display region. Then, the light-emitting material is not left in the peripheral region, and it is not necessary to strictly define the boundary of the region of the above-mentioned solvent for printing (which can be extended into the encapsulating region), so that a structure of the peripheral region need not to be defined, thereby saving the process and further expanding the actual width of the solvent for printing. In addition, compared with the original method of designing a virtual pixel layer, the peripheral region (including the encapsulating region) of the present disclosure does not need to be provided with a virtual pixel layer, which is more advantageous for fabricating a uniform thickness of the light-emitting region when preparing a large-sized substrate plate and is also advantageous in the design requirements of a narrow frame. Finally, compared with the original method of designing a virtual pixel layer, when the pixel defining layer (for defining the ink printed in the display region) is disposed only in the display region, the peripheral region (including the encapsulating region) of the present disclosure may not need to be provided with a virtual pixel layer as described above, and may also not need to provide a pixel defining layer and an opening structure thereof (for separating sub-pixel structures), which is more advantageous for fabricating a uniform thickness of the light-emitting region when preparing a large-sized substrate plate and is also advantageous for the design requirements of a narrow frame. The method of printing a solvent in a region other than the display region will be described in detail below:

According to some embodiments of the present disclosure, the substrate further includes an encapsulating region disposed around the display region. According to some embodiments of the present disclosure, the region where the solvent is printed is away from a printing boundary on one side of the display region and extends into the encapsulating region. That is, the orthographic projection of the region in which the solvent is printed on the substrate overlaps a region of the encapsulating region. Since the solvent printed in the region does not contain a light-emitting material, the solvent for printing does not leave the light-emitting layer material after volatilization and drying, and thus does not adversely affect the encapsulation. Thereby, the width of the region in which the solvent is printed can be expanded into the encapsulating region, thereby improving the film thickness uniformity of the ink jet printing. In other words, since the solvent for printing volatilizes in the subsequent drying treatment and thus does not affect the encapsulation, the encapsulating region can be disposed relatively close to the display region, thereby achieving a narrow frame of the substrate plate.

According to some embodiments of the present disclosure, the encapsulating region is disposed around the display region, and the display region and the encapsulating region are separated by a virtual region for receiving the solvent for printing, that is, a solvent is also printed in the virtual region. According to an embodiment of the present disclosure, the specific distance from a boundary of the region in which the solvent is printed to the encapsulating region is not particularly limited, and those skilled in the art can select it according to actual needs. For example, a boundary of the region in which the solvent is printed may coincide with the boundary of the encapsulating region away from the display region, whereby the performance of the substrate plate manufactured by the method can be further improved.

In order to further improve the encapsulating effect of the encapsulating region, according to a specific embodiment of the present disclosure, said printing a solvent in a region other than the display region may further comprise: printing a solvent in the virtual region, and printing a solvent added with a tackifier in the encapsulating region. According to some embodiments of the present disclosure, the order of printing a solvent in the virtual region, and printing a solvent added with a tackifier in the encapsulating region is not particularly limited, and those skilled in the art can select it according to actual needs. Specifically, when the solvent is printed in the virtual region and the encapsulating region, since the solvent for printing does not leave a light-emitting layer material after the volatilization and drying, the virtual pixel layer is not formed while the consistency of the drying atmosphere between the display region and the peripheral region can be ensured. When the solvent added with the tackifier is printed in the encapsulating region, the added adhesive can increase the adhesion between the encapsulating region and the glass and thus improve the packaging effect, and at the same time, the solvent in the encapsulating region is also printed, which enlarges the area of the solvent for printing and further improves the consistency of the drying atmosphere between the display region and the peripheral region. According to some embodiments of the present disclosure, the specific type of the tackifier is not particularly limited, and those skilled in the art can select it according to actual needs. For example, the tackifier may be selected from one or more of the group consisting of an allyl glycidyl ether, a glycidyl acrylate, an allyl oxabicycloheptane, an allyl propionate, an allyl butyrate, an allyl valerate, an allyl isovalerate, an allyl heptanoate, an allyl octanoate and an allyl citrate.

The specific manner of printing a solvent in the virtual region and printing a solvent to which the tackifier is added in the encapsulating region as described above will be described in detail below:

According to some embodiments of the present disclosure, an orthographic projection of the pixel defining layer on the substrate overlaps an orthographic projection of the virtual region on the substrate, and said printing a solvent in the virtual region comprises printing a solvent on the pixel defining layer in the virtual region. According to some embodiments of the present disclosure, an orthographic projection of the pixel defining layer on the substrate does not overlap an orthographic projection of the encapsulating region on the substrate, and said printing a solvent added with a tackifier in the encapsulating region includes printing a solvent to which a tackifier is added in the area of the substrate in the encapsulating region. Thereby, the uniformity of the drying atmosphere between the display region and the peripheral region can be improved, and the performance of the manufactured substrate plate can be further improved. It should be noted that in the region where the orthographic projection of the pixel defining layer on the substrate overlaps the orthographic projection of the virtual region on the substrate, the opening structure may be the same as the pixel defining layer in the display region; or, the opening structure may not be manufactured, which can further simplify the process.

According to some embodiments of the present disclosure, an orthographic projection of the pixel defining layer on the substrate does not overlap an orthographic projection of the virtual region on the substrate, and said printing a solvent in the virtual region comprises printing a solvent in an area of the substrate in the virtual region. According to some embodiments of the present disclosure, an orthographic projection of the pixel defining layer on the substrate does not overlap an orthographic projection of the encapsulating region on the substrate, and said printing a solvent added with a tackfier in the encapsulating region comprises printing a solvent to which a tackifier is added in the area of the substrate in the encapsulating region. Therefore, a region other than the display region does not need to be provided with a pixel defining layer and the opening structure does not need to be formed, so that the drying atmosphere of the region other than the display region can be made uniform with the drying atmosphere of the display region, and the uniformity of the film thickness of the light-emitting layer can be further improved, which is advantageous for the design requirements of a large-size and a narrow-frame.

In summary, since the light-emitting layer material is not comprised in the substance printed in the region other than the display region in this step, the encapsulation is not affected, and the solvent has a certain hydrophobicity, so that when the substrate plate is manufactured by the method according to an embodiment of the present disclosure, the region other than the display region may have a pixel defining layer, or only the pixel defining layer may be disposed within the display region: the solvent printed in the region other than the display region is only to provide a consistent drying atmosphere, without strictly limiting the boundary for printing, and because of the hydrophobic nature of the solvent itself, there is no need to worry about the printed solvent that is spreading without boundaries on the substrate. When a region other than the display region is provided with a pixel defining layer, the pixel defining layer in that region does not need to form an opening; of course, an opening structure may also be formed in the pixel defining layer of the region other than the display region. That is to say, according to the manufacture method of the embodiment of the present disclosure, any improvement in the step of setting a pixel defining layer in the prior art may not be performed, and only the printing material for the inkjet printing may be changed. Thereby, it is advantageous to carry out production manufacture using an existing production line.

Figure 2:
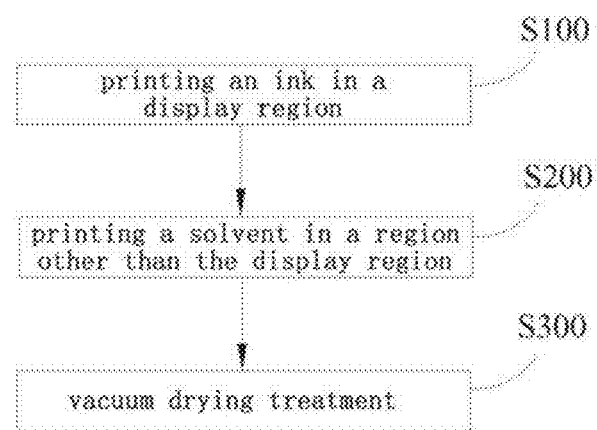
FIG. 2 shows a schematic flow diagram of a method for manufacturing an electroluminescent substrate plate in accordance with some embodiments of the present disclosure.

According to some embodiments of the present disclosure, referring to FIG. 2, the method of manufacturing an electroluminescent substrate plate further comprises:

S300: Vacuum Drying Treatment

In this step, the substrate on which the ink and the solvent are printed is subjected to a drying treatment in a vacuum atmosphere to volatilize the solvent, and thus a light-emitting layer is formed in the display region. Specifically, taking the substrate provided with a display region, a virtual region, and an encapsulating region as an example, before the vacuum drying treatment, referring to (a) in FIG. 5 and (a) in FIG. 6, the display region 110 on the substrate 100 is printed with an ink 10 (including a light-emitting layer material and a solvent), only a solvent 20 is printed in virtual region 120, and a solvent 30 having a tackifier is printed in encapsulating region 130, wherein the order of the printing the ink 10, the solvent 20, and the solvent 30 having a tackifier is not particularly limited, and those skilled in the art can select them according to actual needs. When the vacuum drying treatment is performed, the printed solvents are all volatilized and dried, so that the drying atmosphere in the display region 110 can be kept consistent with that in the virtual region 120 and the encapsulating region 130. After the vacuum drying treatment, referring to (b) in FIG. 5 and (b) in FIG. 6, the remaining light-emitting layer material in the display region 110 forms a light-emitting layer 200, and the remaining tackifier in the encapsulating region 130 forms an auxiliary encapsulating layer 300, while the solvent in the virtual region 120 volatilizes, and thus the virtual pixel layer is not formed. Thereby, it is possible to satisfy the consistency of the drying atmosphere in the display region and the peripheral region for printing a solvent without providing a pixel defining layer.

In summary, the method can easily obtain an electroluminescent substrate plate, and the manufactured electroluminescent substrate plate can satisfy the consistency of the drying atmosphere of the display region and the peripheral region during the film formation by inkjet printing, without providing a pixel defining layer, can significantly improve the film thickness uniformity of the display region, and at the same time is beneficial to the design requirements of a large size and a narrow frame.

In another aspect of the present disclosure, the present disclosure provides an electroluminescent substrate plate. According to some embodiments of the present disclosure, the electroluminescent substrate plate is manufactured by using the methods described above. Thus, all of the features and advantages of the electroluminescent substrate plate manufactured by the method described above can be obtained, and thus will not be described herein. In general, the electroluminescent substrate plate has at least one of the following advantages: the manufactured electroluminescent substrate plate can satisfy the consistency of the drying atmosphere of the display region and the peripheral region during the film formation by inkjet printing, can significantly improve the film thickness uniformity of the display region, and at the same time is beneficial to the design requirements of a large size and a narrow frame.

Figure 3:
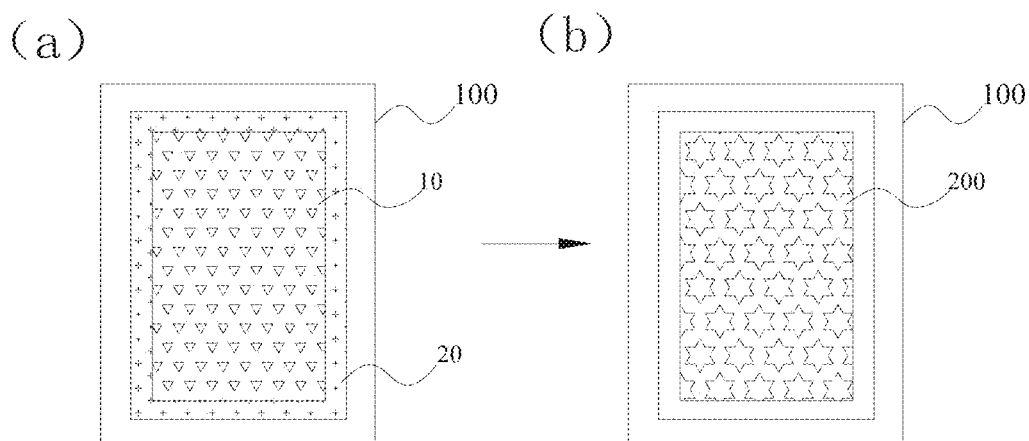
FIG. 3 shows a partial schematic flow diagram of a method for manufacturing an electroluminescent substrate plate in accordance with some embodiments of the present disclosure.
Figure 4:
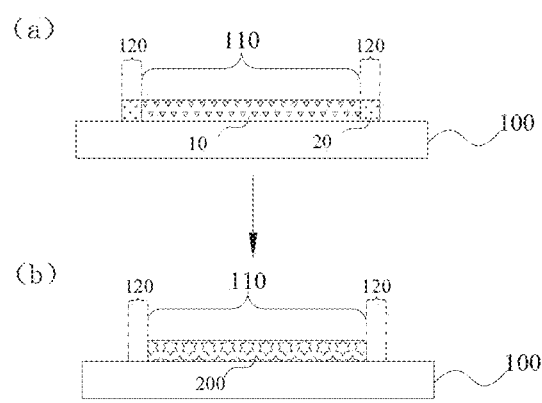
FIG. 4 shows a partial schematic flow diagram of a method for manufacturing an electroluminescent substrate plate in accordance with further embodiments of the present disclosure.

In yet another aspect of the present disclosure, the present disclosure provides an electroluminescent substrate plate. According to some embodiments of the present disclosure, the electroluminescent substrate plate can be an electroluminescent substrate plate as described above or manufactured by the method as described above. Thus, all of the features and advantages of the electroluminescent substrate plate as described above can be obtained, and thus will not be described herein. According to some embodiments of the present disclosure, referring to FIG. 3 and FIG. 4, in which (a) in FIG. 3 and (a) in FIG. 4 are the substrate plates for inkjet printing before drying, and (b) in FIG. 3 and (b) in FIG. 4 are the substrate plates formed after drying, the electroluminescent substrate plate includes a substrate 100 and a light-emitting layer 200. According to some embodiments of the present disclosure, a display region 110 is defined on the substrate 100. According to some embodiments of the present disclosure, the light-emitting layer 200 is formed of the ink 10. Specifically, the ink 10 includes a light-emitting layer material and a solvent capable of dissolving the light-emitting layer material, wherein the solvent in the ink 10 is volatilized in a subsequent vacuum drying treatment, and the remaining light-emitting layer material forms a light-emitting layer 200, and the projection of the region of the light-emitting layer material on the substrate 100 does not coincide with the virtual region 120. According to some embodiments of the present disclosure, a projection of a region of the light-emitting layer material on the substrate 100 is located within the display region 110. That is, an orthographic area of a region where the light-emitting layer material is located on the substrate 100 is less than or equal to an area of the display region 110. Thereby, the light-emitting layer material is not formed in a region other than the display region, thereby not forming a virtual pixel layer, which is advantageous for design requirements of a large size and a narrow frame.

Figure 8:
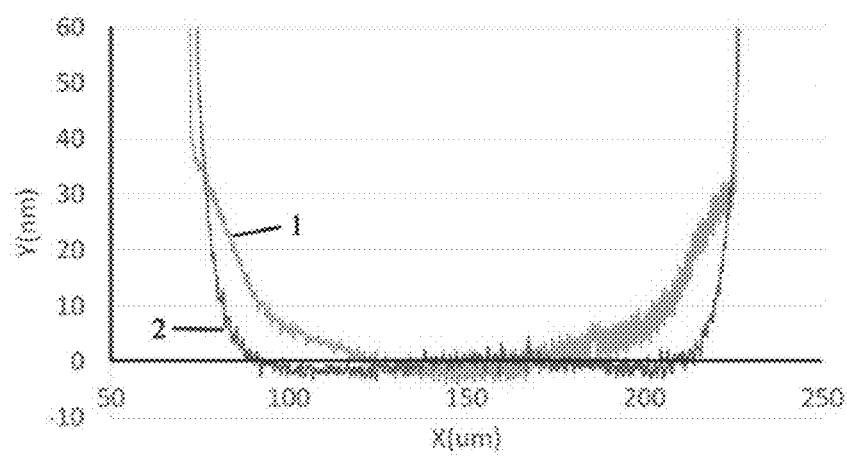
FIG. 8 shows a schematic view of a film formation state of the electroluminescent substrate plate manufactured according to some embodiments of the present disclosure and the electroluminescent substrate plate manufactured by ink-jet printing the same ink as a light-emitting region in the virtual pixel region at a periphery of the light-emitting region.

FIG. 8 shows a schematic view of the film formation state of the electroluminescent substrate plates manufactured according to the embodiments as described above and manufactured by ink-jet printing the same ink as the light-emitting region in the virtual pixel region at the periphery of the light-emitting region. The film formation state described above was measured using a Bruker Dektak-XT small step profiler, which is an instrument for measuring film thickness and morphology. Curve 1 in FIG. 8 shows the film formation state of the electroluminescent substrate plate manufactured according to the method in the above embodiments, wherein since more solvents are printed at the edge position and the solvent atmosphere is sufficient, the film formation in the sub-pixel is good and the film thickness is relatively uniform. Curve 2 in FIG. 8 shows the film formation state of the electroluminescent substrate plate manufactured by ink-jet printing the same ink as the light-emitting region in the virtual pixel region at the periphery of the light-emitting region, wherein since the solvent for the edge protection is relatively insufficient and thus the solvent volatilizes faster, the solvent protection in the sub-pixel is weakened, the film formation in the sub-pixel is poor, resulting in the uniform film thickness.

According to some embodiments of the present disclosure, the specific type of the substrate 100 is not particularly limited, and those skilled in the art can select it according to actual needs. For example, according to some embodiments of the present disclosure, the substrate 100 may be glass. According to some embodiments of the present disclosure, the specific types of the light-emitting layer material and the solvent have been described in detail above and will not be described herein.

According to some embodiments of the present disclosure, a pixel defining layer (not shown) is disposed on the substrate 100. According to some embodiments of the present disclosure, the specific forming material of the pixel defining layer is not particularly limited, and for example, at least a portion of the surface of the pixel defining layer may be formed of a hydrophobic material. According to some embodiments of the present disclosure, the specific formation manner of the pixel defining layer is not particularly limited. For example, the pixel defining layer may include openings (not shown) arranged in an array, and the orthographic projection of the openings on the substrate 100 is located in the display region 110, that is, the orthographic projection of the openings on the substrate 100 does not overlap the virtual region 120, and printing the ink in the display region 110 is achieved by printing the ink into the openings. It should be noted that after the subsequent vacuum drying treatment, the solvent in the ink printed in the display region 110 will volatilize, and the remaining light-emitting layer material will form the light-emitting layer 200 for light emission. Those skilled in the art can understand that, as described above, the pixel defining layer located in the virtual region 120 may also have an open structure.

According to some embodiments of the present disclosure, a virtual region 120 is further defined on the substrate 100, the virtual region 120 is disposed around the display region 110, the virtual region 120 is configured to receive a solvent for printing, and the pixel defining layer is disposed on the substrate 100. Thus, printing a solvent in the virtual region 120 can achieve the consistency of the drying atmosphere of the display region 110 and the virtual region 120, keep the vapor pressure at the edge of the display region 110 during the drying treatment equivalent to the vapor pressure at the center of the display region 110, thereby further improving the film thickness uniformity of the light-emitting layer 200.

Figure 5:
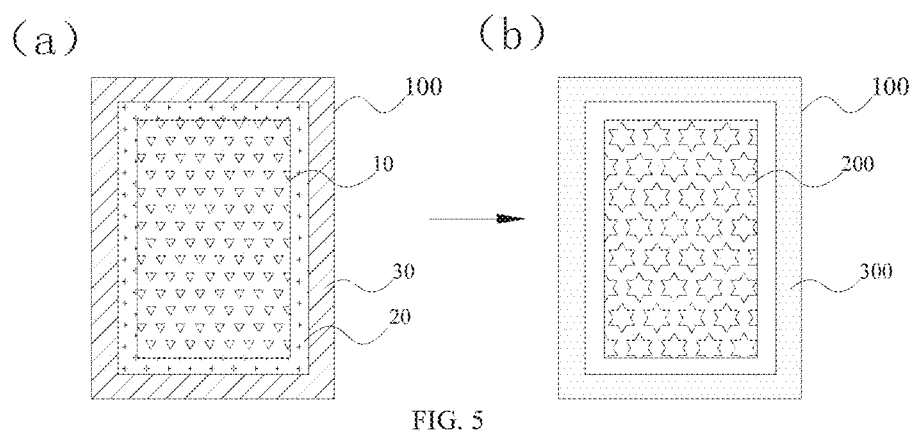
FIG. 5 shows a partial schematic flow diagram of a method for manufacturing an electroluminescent substrate plate in accordance with still further embodiments of the present disclosure.
Figure 6:
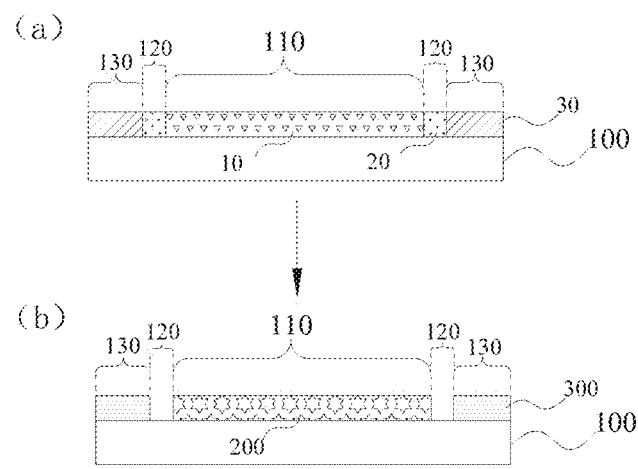
FIG. 6 shows a partial schematic flow diagram of a method for manufacturing an electroluminescent substrate plate in accordance with still further embodiments of the present disclosure.

According to some embodiments of the present disclosure, referring to FIG. 5 and FIG. 6, the substrate 100 further includes a encapsulating region 130, the virtual region 120 is located between the encapsulating region 130 and the display region 110, and the electroluminescent substrate plate further includes an auxiliary encapsulating layer 300 disposed in the encapsulating region 130 and formed of a solvent to which an adhesive is added. Thereby, the auxiliary encapsulating layer 300 can further improve the encapsulating effect. Specifically, the solvent 30 to which the adhesive is added is formed in the encapsulating region 130 by printing, and during the subsequent vacuum drying treatment, the solvent is volatilized, and the remaining adhesive forms the auxiliary encapsulating layer 300. Thereby, the auxiliary encapsulating layer 300 can increase the adhesion to the glass and improve the encapsulating effect. According to some embodiments of the present disclosure, the edge of the auxiliary encapsulating layer 300 away from the side of the display region 110 coincides with the edge of the encapsulating region 130 away from the side of the display region 110. Thereby, the frame of the display device constructed using the electroluminescent substrate plate can be further narrowed. According to some embodiments of the present disclosure, the specific type of tackifier is not particularly limited, and those skilled in the art can select it according to actual needs.

The specific manner of forming the auxiliary encapsulating layer 300 by printing a solvent in the virtual region 120 and printing a solvent added with a tackifier in the encapsulating region 130 will be described in detail below:

According to some embodiments of the present disclosure, an orthographic projection of the pixel defining layer on the substrate 100 overlaps an orthographic projection of the virtual region 120 on the substrate 100, and the pixel defining layer located in the virtual region 120 is configured to receive the solvent for printing. According to some embodiments of the present disclosure, an orthographic projection of the pixel defining layer on the substrate 100 does not overlap an orthographic projection of the encapsulating region 130 on the substrate 100, and the substrate 100 in the encapsulating region 130 is configured to receive a solvent with a tackifier for printing. Thereby, the consistency of the drying atmosphere of the display region 110 and the peripheral region can be improved, and the performance of the manufactured substrate plate can be further improved. It should be noted that in the region where the orthographic projection of the pixel defining layer on the substrate 100 overlaps the orthographic projection of the virtual region 120 on the substrate 100, the opening structure may be the same as the pixel defining layer in the display region 110; or, the opening structure may not be manufactured, which can further simplify the process.

According to some embodiments of the present disclosure, referring to FIG. 5 and FIG. 6, in which (a) in FIG. 5 and (a) in FIG. 6 are the substrate plates for inkjet printing before drying, and (b) in FIG. 5 and (b) in FIG. 6 are the substrate plates formed after drying, an orthographic projection of the pixel defining layer (not shown) on the substrate 100 does not overlap an orthographic projection of the virtual region 120 on the substrate 100, and the substrate 100 in the virtual region 120 is configured to receive the solvent for printing. According to some embodiments of the present disclosure, an orthographic projection of the pixel defining layer on the substrate 100 does not overlap an orthographic projection of the encapsulating region 130 on the substrate 100, and the area of the substrate 100 in the encapsulating region 130 is configured to receive a solvent with a tackifier for printing. Therefore, a region other than the display region does not need to be provided with a pixel defining layer and the opening structure does not need to be formed, so that the drying atmosphere of the region other than the display region can be made consistent with the drying atmosphere of the display region, and the uniformity of the film thickness of the light-emitting layer can be further improved, which is advantageous for the design requirements of a large-size and a narrow-frame.

According to some embodiments of the present disclosure, the virtual region 120 is disposed adjacent to the display region 110 and is reserved for printing the solvent 20, and during the subsequent drying treatment, the solvent 20 is volatilized, and whether the projection of the pixel defining layer on the substrate 100 has an overlapping region with the virtual region 110 has no effect on the volatilization of the solvent 20. Thus, eventually the virtual region 120 in the electroluminescent substrate plate does not form a pixel virtual layer. Thereby, printing a solvent in the virtual region 120 can achieve the consistency of the drying atmosphere of the display region 110 and the virtual region 120, and it is not necessary to provide a pixel defining layer, thereby further improving the film thickness uniformity of the light-emitting layer. The auxiliary encapsulating layer 300 disposed in the encapsulating region 130 is formed by a solvent 30 to which an adhesive is added. During the subsequent drying treatment, the solvent evaporates and the adhesive forms the auxiliary encapsulating layer 300. There is no need to provide a pixel defining layer in the encapsulating region 130 either. Thereby, the encapsulating effect can be further improved.

In sum, the electroluminescent substrate plate has at least one of the following advantages: the manufactured electroluminescent substrate plate can satisfy the consistency of the drying atmosphere of the display region and the peripheral region during the film formation by inkjet printing, can significantly improve the film thickness uniformity of the display region, and at the same time is beneficial to the design requirements of a large size and a narrow frame.

Figure 7:
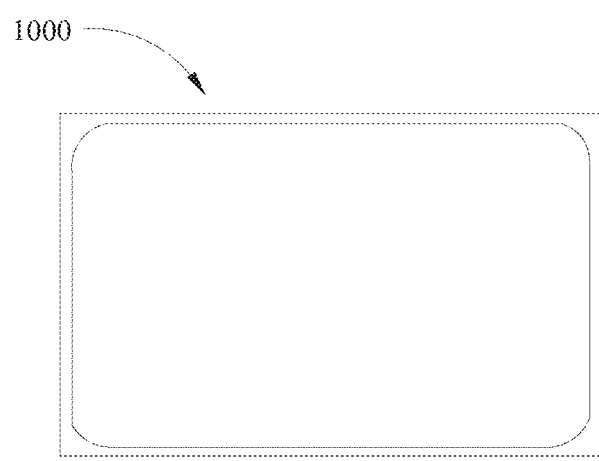
FIG. 7 is a schematic diagram showing a structure of a display device according to some embodiments of the present disclosure.

In still another aspect of the present disclosure, the present disclosure proposes a display device. According to some embodiments of the present disclosure, referring to FIG. 7, the display device 1000 includes the electroluminescent substrate plate described above. Thus, the display device 1000 can have all of the features and advantages of the electroluminescent substrate plate described above, which are not described herein. In general, the display device 1000 has at least one of the following advantages: the display device 1000 can satisfy the consistency of the drying atmosphere of the display region and the peripheral region during the film formation by inkjet printing without providing a pixel defining layer, can significantly improve the film thickness uniformity of the display region, and at the same time is beneficial to the design requirements of a large size and a narrow frame.

In summary, the present disclosure is capable of achieving at least one of the following beneficial effects:

The method of the present disclosure can easily obtain an electroluminescent substrate plate, and the manufactured electroluminescent substrate plate can satisfy the drying atmosphere consistency of the display region and the peripheral region during the film formation by inkjet printing without providing a pixel defining layer, can significantly improve the film thickness uniformity of the display region, and at the same time is beneficial to the design requirements of a large size and a narrow frame.

Since the light-emitting material is not contained in the solvent printed in a region other than the display region, the encapsulation is not adversely affected, whereby the width of the region of the printed solvent can be expanded, thereby improving the uniformity of the film thickness obtained by the inkjet printing.

The present disclosure can also save a process of providing an opening in a region of a solvent for printing, which is advantageous for improving the production efficiency of the substrate plate.

Printing a solvent in a region other than the display region of the disclosure can satisfy the consistency of the drying atmosphere between the display region and the peripheral region during the film formation by inkjet printing; the added adhesive can increase the adhesion between the encapsulating region and the glass, and thus improve the encapsulating effect.

The present disclosure can also further improve the performance of the manufactured substrate plate.

In the present disclosure, a region other than the display region does not need to be provided with a pixel defining layer and the opening structure does not need to be formed, so that the drying atmosphere of the region other than the display region can be made consistent with the drying atmosphere of the display region, and the uniformity of the film thickness of the light-emitting layer can be further improved.

According to the present disclosure, it is not necessary to form a pixel defining layer in the encapsulating region, and the added adhesive can increase the adhesion between the encapsulating region and the glass, and thus improve the encapsulating effect.

The electroluminescent substrate plate of the present disclosure may have all of the features and advantages of the electroluminescent substrate plate manufactured by the method described above, which will not be further described herein. In general, the electroluminescent substrate plate has at least one of the following advantages: the manufactured electroluminescent substrate plate can satisfy the consistency of the drying atmosphere of the display region and the peripheral region during the film formation by inkjet printing, can significantly improve the film thickness uniformity of the display region, and at the same time is beneficial to the design requirements of a large size and a narrow frame.

According to the present disclosure, printing a solvent in the virtual region can achieve the consistency of the drying atmosphere of the display region and the virtual region, keep the vapor pressure at the edge of the display region during the drying treatment equivalent to the vapor pressure at the center of the display region, thereby further improving the film thickness uniformity of the light-emitting layer.

According to the present disclosure, the auxiliary encapsulating layer can further improve the encapsulating effect.

In addition, the display device according to the present disclosure can have all of the features and advantages of the electroluminescent substrate plate described above, which are not described herein. In general, the display device has at least one of the following advantages: the display device can satisfy the consistency of the drying atmosphere of the display region and the peripheral region during the film formation by inkjet printing, can significantly improve the film thickness uniformity of the display region, and at the same time is beneficial to the design requirements of a large size and a narrow frame.

In the description of the present disclosure, the orientation or positional relationship of the terms "upper", "lower" and the like is based on the orientation or positional relationship shown in the drawings, and is merely for the convenience of describing the present disclosure and does not require that the disclosure must be constructed and operated in a specific orientation, and therefore cannot to be construed as limiting the disclosure.

In the description of the present specification, the description of the terms "one embodiment", "another embodiment" or the like means that the specific features, structures, materials or characteristics described in connection with the embodiments are included in at least one embodiment of the present disclosure. In the present specification, the schematic representation of the above terms is not necessarily directed to the same embodiment or example. Furthermore, the specific features, structures, materials, or characteristics described may be combined in a suitable manner in any one or more embodiments or examples. Further, those skilled in the art can combine the features of the various embodiments or examples described in the specification without departing from each other. In addition, it should be noted that in the present specification, the terms "first" and "second" are used for descriptive purposes only, and are not to be construed as indicating or implying a relative importance or implicitly indicating the number of technical features indicated.

While some embodiments of the present disclosure have been shown and described above, it is understood that the above-described embodiments are illustrative and are not to be construed as limiting the scope of the disclosure. Changes, modifications, alterations and variations of the above-described embodiments may be made by those skilled in the art within the scope of the present disclosure.

The invention claimed is:

1. A method of manufacturing an electroluminescent substrate plate, wherein the electroluminescent substrate plate comprises a substrate and a light-emitting layer on the substrate, and the method comprises:

printing an ink in a display region of the substrate, the ink comprises a light-emitting layer material, and a solvent capable of dissolving the light-emitting layer material; and printing the solvent capable of dissolving the light-emitting layer material in a region other than the display region of the substrate and the substrate further comprises an encapsulating region configured to surround the display region, and wherein the region where the solvent is printed is away from a printing boundary on one side of the display region and extends into the encapsulating region.

2. The method of claim 1, further comprising disposing a pixel defining layer comprising openings arranged in an array on the substrate, and then printing the ink into the openings; and an orthographic projection of the openings on the substrate is located within the display region, and the solvent is printed in an region other than the display region.

3. The method of claim 1, further comprising disposing a pixel defining layer comprising openings arranged in an array on the substrate before printing the ink, and then printing the ink into the openings; and an orthographic projection of the openings on the substrate is located within the display region, and the solvent is printed in an region other than the display region.

4. The method of claim 3, wherein a virtual region is further included between the display region and the encapsulating region, said printing a solvent further comprising:

printing the solvent in the virtual region; and printing the solvent added with a tackifier in the encapsulating region.

5. The method of claim 4, wherein an orthographic projection of the pixel defining layer on the substrate overlaps an orthographic projection of the virtual region on the substrate, and said printing the solvent in the virtual region comprises printing the solvent on a pixel defining layer in the virtual region.

6. The method of claim 4, wherein an orthographic projection of the pixel defining layer on the substrate does not overlap an orthographic projection of the virtual region on the substrate, and said printing the solvent in the virtual region comprises printing the solvent in the area of the substrate in the virtual region.

7. The method of claim 4, wherein an orthographic projection of the pixel defining layer on the substrate does not overlap an orthographic projection of the encapsulating region on the substrate, and the solvent added with a tackifier is printed in the area of the substrate in the encapsulating region.

* * * * *